(12) United States Patent
Bourstein

(10) Patent No.: US 8,169,234 B1
(45) Date of Patent: *May 1, 2012

(54) NO STRESS LEVEL SHIFTER

(75) Inventor: Ido Bourstein, Pardes Hana (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 0 days.

This patent is subject to a terminal disclaimer.

(21) Appl. No.: 13/013,050

(22) Filed: Jan. 25, 2011

Related U.S. Application Data

(63) Continuation of application No. 12/391,566, filed on Feb. 24, 2009, now Pat. No. 7,884,646.

(60) Provisional application No. 61/032,217, filed on Feb. 28, 2008.

(51) Int. Cl.
*H03K 19/0175* (2006.01)

(52) U.S. Cl. .............................. 326/81; 326/68; 327/333

(58) Field of Classification Search .................. 326/63, 326/68, 80–83, 86; 327/108–109, 333
See application file for complete search history.

(56) References Cited

U.S. PATENT DOCUMENTS

| | | | |
|---|---|---|---|
| 4,689,503 A * | 8/1987 | Suzuki et al. ................ 326/65 |
| 5,369,313 A * | 11/1994 | Yoshihara ..................... 326/68 |
| 5,754,059 A | 5/1998 | Tanghe et al. |
| 5,821,800 A * | 10/1998 | Le et al. ........................ 327/333 |
| 6,043,699 A | 3/2000 | Shimizu |
| 6,242,962 B1 | 6/2001 | Nakamura |
| 6,359,473 B1 | 3/2002 | You et al. |
| 7,200,053 B2 | 4/2007 | Kim et al. |
| 7,224,202 B2 * | 5/2007 | Pauletti ........................ 327/333 |
| 7,245,153 B2 | 7/2007 | Murakami |
| 7,248,075 B2 | 7/2007 | Min et al. |
| 7,352,229 B1 | 4/2008 | Mei et al. |
| 7,400,168 B2 | 7/2008 | Katou |
| 7,609,090 B2 * | 10/2009 | Srivastava et al. ............. 326/80 |
| 7,884,646 B1 * | 2/2011 | Bourstein ...................... 326/81 |
| 2004/0164766 A1 * | 8/2004 | Yu ................................ 326/68 |
| 2005/0206635 A1 | 9/2005 | Hashimoto |
| 2006/0066349 A1 * | 3/2006 | Murakami .................... 326/81 |
| 2007/0159215 A1 | 7/2007 | Deng et al. |
| 2008/0197906 A1 * | 8/2008 | Mei et al. ...................... 327/333 |
| 2008/0231321 A1 * | 9/2008 | Herzer et al. .................. 326/63 |

\* cited by examiner

*Primary Examiner* — Jason M Crawford

(57) ABSTRACT

A voltage level shifting circuit may include a differential first-stage level shifter that receives a binary input signal and generates a non-inverted first-stage shifted output signal and an inverted first-stage shifted output signal, a second-stage level shifter that receives the first-stage shifted output signals and generates a non-inverted second-stage shifted output signal and an inverted second-stage shifted output signal, and a signal generator that generates a level shifted final output signal corresponding to the binary input signal that is based on the non-inverted second-stage shifted output signal and the inverted second-stage shifted output signal. The voltage swing of the first stage output signals may be limited to swing between a non-zero lower value and an upper value that is less than or equal to a source-to-drain voltage rating of transistors in the differential first-stage level shifter.

20 Claims, 10 Drawing Sheets

NO STRESS LEVEL SHIFTER

CROSS-REFERENCE TO RELATED APPLICATIONS

This application is a continuation of U.S. application Ser. No. 12/391,566, filed Feb. 24, 2009, now U.S. Pat. No. 7,884,646 issued Feb. 8, 2011, which claims the benefit of U.S. Application No. 61/032,217 filed Feb. 28, 2008. The disclosures of the applications referenced above are incorporated herein by reference.

INCORPORATION BY REFERENCE

This application claims the benefit of U.S. Provisional Application No. 61/032,217, "No Stress Level Shifter," filed by Ido Bourstein on Feb. 28, 2008, which is incorporated herein by reference in its entirety.

BACKGROUND

Subjecting a transistor within an integrated circuit to over-voltage conditions, e.g., placing a voltage across the source-to-drain terminals of a transistor that exceeds the transistor's maximum source-to-drain rating, places an over-voltage stress on the transistor. Transistors in circuits designed to amplify, or shift upwards, the voltage level of an incoming signal are particularly susceptible to design oversights and/or other conditions that result in over-voltage stress being applied to one or more transistors in the circuit. Such circuits are often used to support physical interfaces between circuits that operate using different e.g., higher, operating voltages. Such level-shifting circuits may be more likely to suffer from over-voltage conditions as a result of managing voltage levels that may exceed one or more maximum voltage ratings of individual transistors in the circuit. For example, level shifting circuits that support physical interfaces between devices may be vulnerable to over-voltage stress when physical devices are either connected or disconnected.

A single incident of over-voltage stress may not result in failure of the circuit. However, it is desirable to avoid over-voltage stress because regular incidents of over-voltage stress may eventually result in permanent changes in the operational characteristics of a transistor, which may distort the operation of the circuit and/or result in failure of the circuit at a functional level.

SUMMARY

A multi-stage level shifter is described that eliminates over-voltage stress of transistors included in the multi-stage level shifter. The multi-stage level shifter may include a first stage differential level shifter having transistors and configured to output a differential digital signal based on a single ended input digital signal, wherein a voltage swing of the differential digital signal swings between a non-zero voltage value and a voltage value that is less than or equal to a maximal voltage rating of the transistors.

A level shifter is described that may include a differential first-stage level shifter, a differential second-stage level shifter and a comparator. The differential first-stage level shifter may receive a single ended binary input signal, $V_{IN}$, and may generate differential first-stage shifted output signals, $+V1_{OUT}$ and $-V1_{OUT}$. In accordance with an embodiment, an output of the differential first stage level shifter has a limited voltage swing. For example, a voltage swing limitation may be imposed at the LOW voltage state, since the output of the first stage is provided as an input to a downstream level shifter. Consequently, by limiting voltage swing without limiting the HIGH voltage state, a higher starting point for downstream voltage amplification can be provided without stressing transistors. The differential second-stage level shifter may receive first-stage shifted output signals, $+V1_{OUT}$ and $-V1_{OUT}$, and may generate differential second-stage shifted output signals, $+V2_{OUT}$ and $-V2_{OUT}$. The comparator may receive second-stage shifted output signals, $+V2_{OUT}$ and $-V2_{OUT}$, and may generate a final shifted output signal, $V_{OUT}$.

The use of differential first-stage and second-stage level shifters allows the level shifter to support a wide range of operation with respect to the final shifted output signal HIGH voltage. Depending on the requirements of a physical interface to be supported, in accordance with an embodiment the final shifted output signal HIGH voltage may be varied to any voltage between 2.0 volts to 3.6 volts based on the selected voltage of HIGH source voltage, $V3_{DD}$, provided to the circuit comparator. In this manner, embodiments of the level shifter may be dynamically configured to support the requirements of an interface by merely selecting a desired $V3_{DD}$ voltage source and without modifying the circuit.

As noted, embodiments of the described level shifter may purposefully limit the output swing of the first-stage level shifter. For example, the first-stage level shifter may include a pair of leaker circuits and a pair of diode circuits that work together to assure that the LOW output of the first-stage level shifter is always greater than the LOW source voltage, $V1_{SS}$, supplied to the first-stage level shifter. As a result, the voltage swing of the output signal generated by the first-stage level shifter is limited and the risk that transistors in the second-stage level shifter portion of the circuit may be subjected to over-voltage stress is reduced.

Embodiments of the level shifter may include a second-stage level shifter that is self-biased, i.e., does not require power from an externally generated intermediate LOW voltage source. Elimination of the need for such an intermediate LOW voltage source by the second-stage level shifter may obviate the need for circuitry that, otherwise, would be required to provide such an intermediate LOW voltage source, thereby enabling reduction of the overall circuit footprint and reduction of the overall power consumption.

Embodiments of the level shifter may support an input signal monitoring feature that maintains a predefined first-stage level shifter differential output when no input signal is provided to the level shifter. By maintaining a predefined first-stage level shifter differential output in the first-stage shifter when no input signal is provided, the level shifter avoids the creation of undefined states in the second-stage shifter that may lead to over-voltage stress of transistors in the second-stage shifter. Moreover, the final output of the level shifter will be set to a predefined voltage.

For example, embodiments of the level shifter may be used in any circuit that requires level shifting of a 1.0 volt input signal to a shifted output signal between 2.0 and 3.3 volts±10% using, for example, CMOS transistors rated to support a maximum source-to-drain voltage of 1.8 volts±10%.

For example, the described level shifter may be included in a controller, e.g., within an integrated circuit and/or in a system on chip, that controls the interfacing of a microprocessor with one or more peripheral devices, timers, and/or transceivers that are operating at different input/output signal voltage levels and/or that drives one or more sets of general purpose input/output pins having different input/output signal voltage levels.

In accordance with an embodiment, a voltage level shifting circuit may include, a differential first-stage level shifter that may include transistors having a voltage rating that may be configured to receive a binary input signal and to generate a non-inverted first-stage limited voltage swing shifted output signal and an inverted first-stage limited voltage swing shifted output signal, in which the voltage swing of the limited voltage swing output signals may swing between a non-zero lower value and an upper value that may be less than or equal to the voltage rating, a second-stage level shifter that may receive the non-inverted first-stage limited voltage swing shifted output signal and the inverted first-stage limited voltage swing shifted output signal and may generate a non-inverted second-stage shifted output signal and an inverted second-stage shifted output signal, and a signal generator that may generate a level shifted final output signal corresponding to the binary input signal that may be based on the non-inverted second-stage shifted output signal and the inverted second-stage shifted output signal.

Another example embodiment may include a method of generating a level shifted signal that may include generating a voltage swing limited non-inverted first-stage shifted output signal and voltage swing limited inverted first-stage shifted output signal based on a received binary input signal, in which the voltage swing of the voltage swing limited first stage shifted output signals may swing between a non-zero value and a value that is less than or equal to a voltage rating of a transistor in a circuit generating the first stage shifted output signals, generating a non-inverted second-stage shifted output signal and an inverted second-stage shifted output signal based on the non-inverted first-stage shifted output signal and the inverted first-stage shifted output signal, and generating a final output signal corresponding to the received binary signal that is based on the non-inverted second-stage shifted output signal and the inverted second-stage shifted output signal.

Yet another example embodiment may include an integrated circuit that may include a voltage level shifting circuit may include, a differential first-stage level shifter that may include transistors having a voltage rating that may be configured to receive a binary input signal and to generate a non-inverted first-stage limited voltage swing shifted output signal and an inverted first-stage limited voltage swing shifted output signal, in which the voltage swing of the limited voltage swing output signals may swing between a non-zero lower value and an upper value that may be less than or equal to the voltage rating, a second-stage level shifter that may receive the non-inverted first-stage limited voltage swing shifted output signal and the inverted first-stage limited voltage swing shifted output signal and may generate a non-inverted second-stage shifted output signal and an inverted second-stage shifted output signal, and a signal generator that may generate a level shifted final output signal corresponding to the binary input signal that may be based on the non-inverted second-stage shifted output signal and the inverted second-stage shifted output signal.

BRIEF DESCRIPTION OF THE DRAWINGS

Examples of a level shifter that avoids over-voltage stress will be described with reference to the following drawings, wherein like numerals designate like elements, and wherein.

DETAILED DESCRIPTION OF EMBODIMENTS

Figure 1:
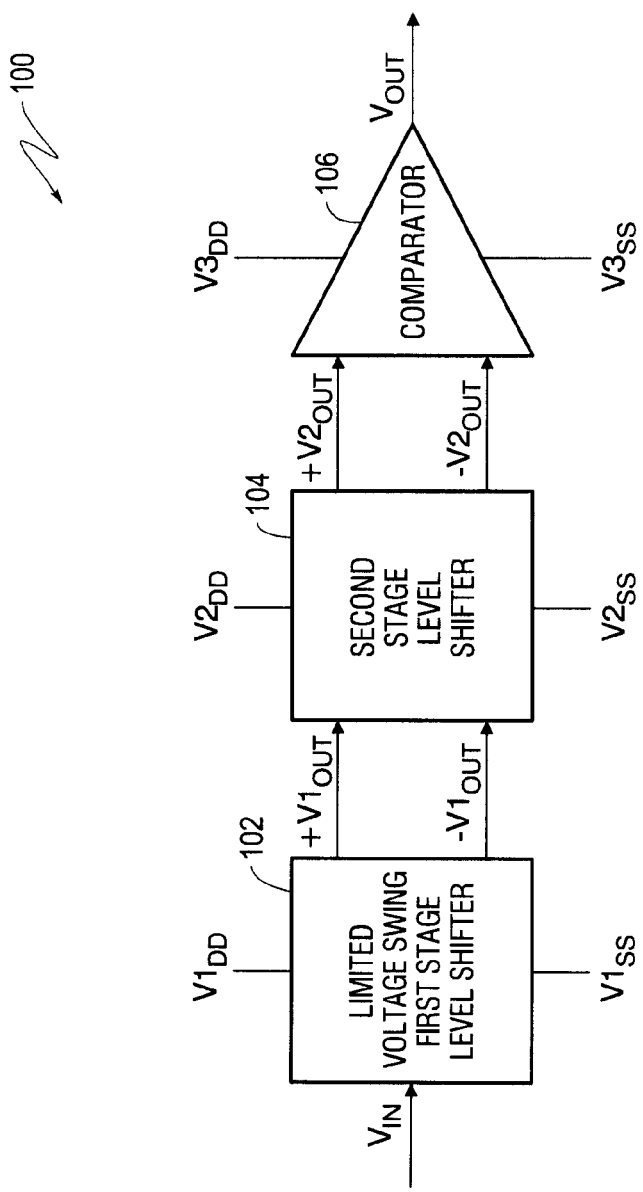
FIG. 1 is a schematic diagram of a level shifter which is protected from over-voltage stress in accordance with an embodiment of the invention.

FIG. 1 is schematic diagram of a level shifter which is protected from over-voltage stress. In the example seen, the level shifter has two level shifting stages and a comparator. The level shifter 100 may be used in any circuit that requires level shifting of a 1.0 volt input signal to a shifted output signal as high as 3.3 volts±10% using 1.8 volt±10% CMOS transistors. Such transistors may be used, for example, in 90 nm and 65 nm CMOS semiconductor photolithographic fabrication processes. The representative level shifter 100 may be used as part of an on die voltage regulator or may be used as part of an interface between components operating at different predefined voltage levels. For representative level shifter 100 may be included in a controller integrated on an integrated circuit that controls the interfacing of a microprocessor with one or more peripheral devices, timers, and/or transceivers that are operating at different input/output signal voltage levels and/or a controller that drives one or more sets of general purpose input/output pins having different input/output signal voltage levels. It is noted that other level shifting configurations providing a similar functionality may be contemplated.

As shown in FIG. 1, level shifter 100 may include a first-stage level shifter 102, a second-stage level shifter 104, and a comparator, 106. Example embodiments of level shifter 100, constructed using, for example, thick oxide CMOS transistor technology in which the maximum source-to-drain voltage of each transistor is 1.8 volts±10%, may be configured using design principles described below to generate shifted output signal voltages as high as 3.6 volts, i.e., 3.3 volts±10%, without subjecting any transistors in the circuit to over-voltage stress. In addition, example embodiments of level shifter 100 may support a wide range of operation with respect to the shifted final output, $V_{OUT}$, HIGH voltage which may vary, for example, to any value between 2.0 volts to 3.6 volts, and which may be dynamically configured to support the requirements of an interface to be supported without changes to the circuit, as described below. Further, in example embodiments of level shifter 100, second-stage level shifter 104 may be self-biased, i.e., may not require the external generation of an intermediate LOW voltage source, $V2_{SS}$, as described in greater detail below. Embodiments may support a power-off feature that maintains defined transistor states and a defined circuit output when no input signal, $V_{IN}$, is provided, thereby avoiding transistor over-voltage stress conditions that may result from undefined circuit states. The elimination of transistor over-voltage stress extends the life of transistors within the circuit, thereby extending the reliable operational performance of the circuit.

In operation, in embodiments of level shifter 100, the first-stage level shifter 102 may be configured such that its output signals have a limited voltage swing. The first stage level shifter 102 receives an input signal, $V_{IN}$, with a LOW voltage level of, for example, 0 volts and a HIGH voltage level of, for example, 1 volt and may generate a corresponding shifted differential first output signal, $+V1_{OUT}$, and a corresponding inverted shifted first output signal, $-V1_{OUT}$. Each of the output signals may have a voltage that swings between a LOW voltage level that is non-zero and a HIGH voltage level that is less than or equal to a voltage rating of transistors in the voltage shifting circuit. The magnitude of the first stage voltage swing may be limited so that it is less than the rating of the transistors in the voltage shifting circuit. Second-stage level shifter 104 may receive first shifted output signal, $+V1_{OUT}$, and inverted shifted first output signal, $-V1_{OUT}$ and may generate a corresponding shifted second output signal, $+V2_{OUT}$, and a corresponding inverted shifted second output signal, $-V2_{OUT}$. Comparator 106 may receive second output signal, $+V2_{OUT}$, inverted shifted second output signal, $-V2_{OUT}$ and may generate a shifted final output signal, $V_{OUT}$.

For example, in one embodiment of level shifter 100, that is configured as a two stage level shifter using CMOS transistors rated at 1.8 volt±10%, in response to an input signal, $V_{IN}$, with a LOW voltage level of, for example, 0 volts, first-stage level shifter 102 may generate a corresponding LOW shifted first output signal, $+V1_{OUT}$, e.g., +0.5 volts, and a corresponding HIGH inverted shifted first output signal, $-V1_{OUT}$, e.g., +1.8 volts. In response to an input signal, $V_{IN}$, with a HIGH voltage level of, for example, +1.0 volts, first-stage level shifter 102 may generate a corresponding HIGH shifted first output signal, $+V1_{OUT}$, e.g., +1.8 volts, and a corresponding LOW inverted shifted first output signal, $-V1_{OUT}$, e.g., +0.5 volts. As described in greater detail below, first-stage level shifter 102 may be configured to purposefully not use the full possible amplification swing of 1.8 volts±10% that may be supported by transistors in first-stage level shifter 102 in order to avoid over-voltage stress in transistors of second-stage level shifter 104.

In response to a LOW shifted first output signal, $+V1_{OUT}$, e.g., +0.5 volts, and a HIGH inverted shifted first output signal, $-V1_{OUT}$, e.g., +1.8 volts, second-stage level shifter 104 may generate a corresponding LOW shifted second output signal, $+V2_{OUT}$, e.g., +2.0 volts, and a corresponding HIGH inverted shifted second output signal, $-V2_{OUT}$, e.g., +2.8 volts. In response to a HIGH shifted first output signal, $+V1_{OUT}$, e.g., +1.8 volts, and a LOW inverted shifted first output signal, $-V1_{OUT}$, e.g., +0.5 volts, second-stage level shifter 104 may generate a corresponding HIGH shifted second output signal, $+V2_{OUT}$, e.g., +2.8 volts, and a corresponding LOW inverted shifted second output signal, $-V2_{OUT}$, e.g., +2.0 volts.

In response to a LOW shifted second output signal, $+V2_{OUT}$, e.g., +2.0 volts and a HIGH inverted shifted second output signal, $-V2_{OUT}$, e.g., +2.8 volts, comparator 106 may generate a corresponding LOW shifted final output, $V_{OUT}$, e.g., +1.8 volts±10%. In response to a HIGH shifted second output signal, $+V2_{OUT}$, e.g., +2.8 volts and a LOW inverted shifted second output signal, $-V2_{OUT}$, e.g., +2.0 volts, comparator 106 may generate a corresponding HIGH shifted final output, $V_{OUT}$, e.g., +3.3 volts±10%.

Figure 2:
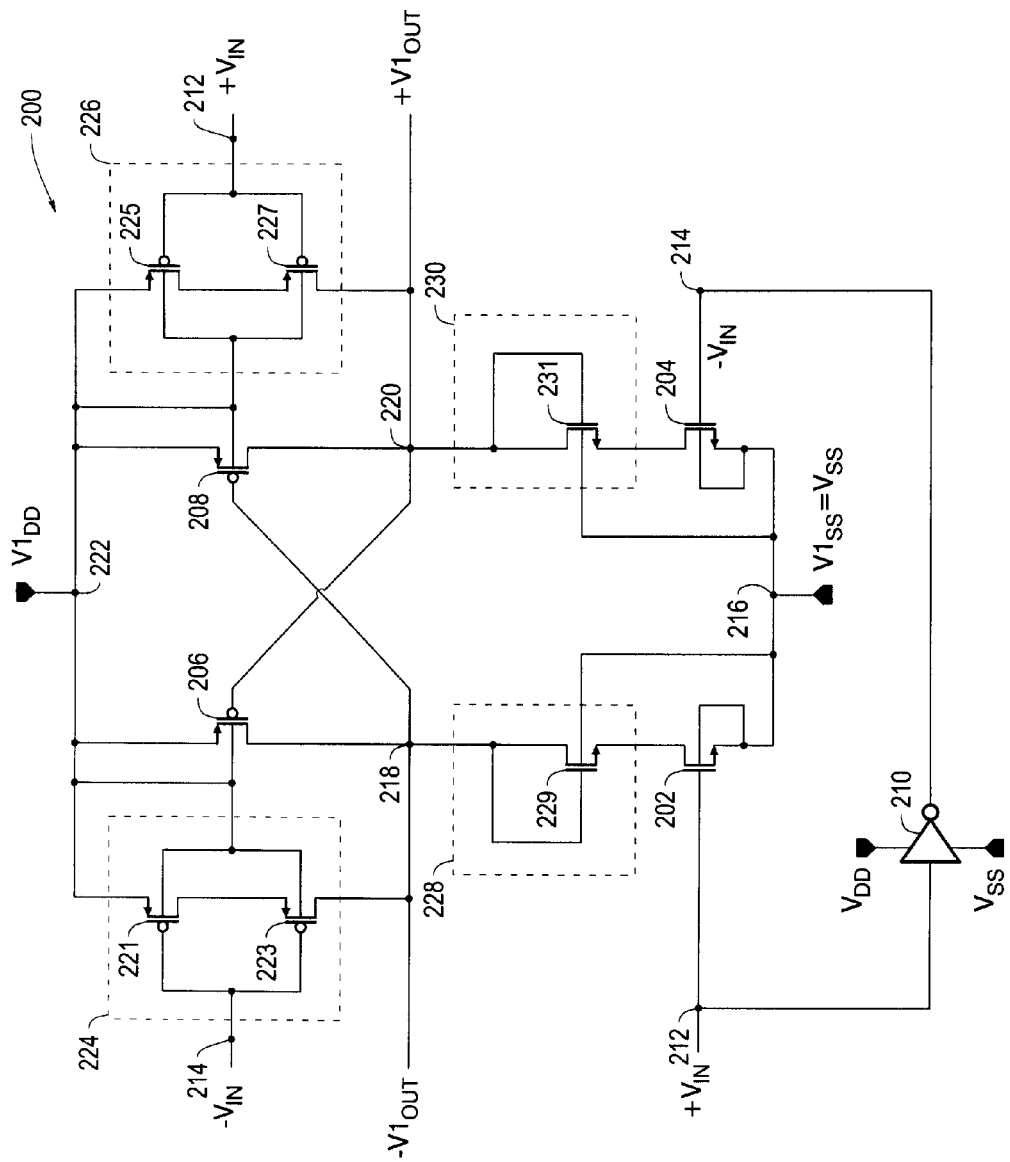
FIG. 2 is an example circuit embodiment of the first-stage level shifter shown in FIG. 1.

FIG. 2 is a first example embodiment of the first-stage limited voltage swing level shifter, described above with respect to FIG. 1. As shown in FIG. 2, a first example circuit embodiment 200 of a limited voltage swing first-stage level shifter circuit may be configured as a single ended input to differential output level shifter and may include a first N-type MOS transistor 202, a second N-type MOS transistor 204, a first P-type MOS transistor 206, a second P-type MOS transistor 208, an inverter 210, a left side leaker circuit 224, a right side leaker circuit 226, a left-side diode circuit 228, a right-side diode circuit 230, a LOW voltage source, $V1_{SS}$, and high voltage source, $V1_{DD}$. As further shown in FIG. 2, each transistor in first-stage limited voltage swing level shifter circuit embodiment 200 may include a gate terminal, or gate, a source terminal, or source, and a drain terminal, or drain, and a base terminal, or base.

The source of P-type MOS transistor 206 and the source of P-type MOS transistor 208 may be connected to the HIGH voltage source, $V1_{DD}$, at node 222. The drain of P-type MOS transistor 206 and the gate of P-type MOS transistor 208 may be connected to the source of N-type MOS transistor 202 at node 218 via left-side diode circuit 228. The drain of P-type MOS transistor 208 and the gate of P-type MOS transistor 206 may be connected to the source of N-type MOS transistor 204 at node 220 via right-side diode circuit 230. The drain of N-type MOS transistor 202 and the drain of N-type MOS transistor 204 may be connected to the LOW voltage source, $V1_{SS}$, at node 216. An input node of inverter 210 may be connected to the gate of N-type MOS transistor 202 at node 212 and the output of inverter 210 may be connected to the gate of N-type MOS transistor 204 at node 214.

Left-side diode circuit 228 may include an N-type MOS transistor 229 with its gate and source tied so that the MOS transistor acts as a MOS diode/active resistor. The source of N-type MOS transistor 229 may be connected to node 218 and the drain of N-type MOS transistor 229 may be connected to the source of N-type MOS transistor 202. Right-side diode circuit 230 may include an N-type MOS transistor 231 with its gate and source tied so that the MOS transistor acts as a MOS diode/active resistor. The source of N-type MOS transistor 231 may be connected to node 220 and the drain of N-type MOS transistor 231 may be connected to the source of N-type MOS transistor 204. Left-side diode circuit 228 and right-side diode circuit 230 may be referred to collectively as the first-stage level shifter diode circuit.

Left side leaker circuit 224 may include P-type MOS transistor 221 and P-type MOS transistor 223 connected in series. As shown in FIG. 2, the source of P-type MOS transistor 221 may be connected to HIGH voltage source $V1_{DD}$, the drain of P-type MOS transistor 221 may be connected to the source of P-type MOS transistor 223, and the drain of P-type MOS transistor 223 may be connected to node 218. The gates of P-type MOS transistor 221 and P-type MOS transistor 223 may be connected together at node 214.

Right side leaker circuit 226 may include P-type MOS transistor 225 and P-type MOS transistor 227 connected in series. As shown in FIG. 2, the source of P-type MOS transistor 225 may be connected to HIGH voltage source $V1_{DD}$, the drain of P-type MOS transistor 225 may be connected to the source of P-type MOS transistor 227, and the drain of P-type MOS transistor 227 may be connected to node 220. The gates of P-type MOS transistor 225 and P-type MOS transistor 227 may be connected together at node 212. Left side leaker circuit 224 and right side leaker circuit 226 may be referred to collectively as the first-stage level shifter leaker circuit.

As further shown in FIG. 2, the base of P-type MOS transistor 206, P-type MOS transistor 208, P-type MOS transistor 221, P-type MOS transistor 223, P-type MOS transistor 225, and P-type MOS transistor 227 may be connected to, and biased by, HIGH voltage source $V1_{DD}$. The base of N-type MOS transistor 202, N-type MOS transistor 204, N-type MOS transistor 229, and N-type MOS transistor 231 may be connected to, and biased by, LOW voltage source $V1_{SS}$.

In operation, first-stage level shifter circuit embodiment 200 may operate in a manner similar to that of a conventional single-stage level shifter. For example, a binary input signal, $V_{IN}$, with a LOW voltage level of 0 volts and a HIGH voltage level of 1 volt may be applied to first-stage level shifter circuit embodiment 200 at node 212 resulting in a corresponding shifted output signal, +V1out, being generated at node 220 and a corresponding inverted shifted output signal, −V1out, being generated at node 218. For example, when input signal, $V_{IN}$, is LOW, N-type MOS transistor 202 is OPEN, the output of inverter 210, is HIGH and N-type MOS transistor 204 is CLOSED. As a result, the voltage of shifted output signal, +V1out, at node 220 is pulled down to the shifted LOW value $V1_{SS}$. In response to the LOW value at node 220, P-type MOS transistor 206 is CLOSED, and the inverted shifted output signal, $-V_{OUT}$, at node 218 is pulled up to the shifted HIGH voltage $V1_{DD}$. Similarly, when input signal, $V_{IN}$, is HIGH, N-type MOS transistor 202 is CLOSED, the output of inverter 210, is LOW and N-type MOS transistor 204 is OPEN. As a result, the voltage of inverted shifted output signal, −V1out, at node 218 is pulled down to the shifted LOW value, $V1_{SS}$. In response to the LOW value at node 218, P-type MOS transistor 208 is CLOSED, and the shifted output signal, +V1out, at node 220 is pulled up to the shifted HIGH voltage, $V1_{DD}$.

However, operation of first-stage level shifter circuit embodiment 200 differs from operation of a conventional single-stage level shifter in several ways. First, leaker circuit 224 in combination with diode circuit 228 and leaker circuit 226 in combination with diode circuit 230 assure that the LOW output of first-stage level shifter circuit embodiment 200 is always greater than $V1_{SS}$, as described in greater detail below. This has the effect of limiting the output swing of the first-stage level shifter to a swing less than $V1_{DD}$ minus $V1_{SS}$. Limiting the output swing of the first-stage level shifter reduces the risk that transistors in the second-stage level shifter may be subjected to over-voltage stress, as described in greater detail below.

Second, leaker circuit 224 and leaker circuit 226 provide a constant current flow through first-stage level shifter circuit embodiment 200, either through the left side of first-stage level shifter circuit embodiment 200, i.e., from node 222 to node 216 via node 218, when $V_{IN}$ is HIGH and driving $-V1_{OUT}$ LOW, or via the right side of first-stage level shifter circuit embodiment 200, i.e., from node 222 to node 216 via node 220, when $V_{IN}$ is LOW and driving $V1_{OUT}$ LOW. By making sure that the diode circuit adjacent to the LOW output value of the level shifter conducts a small amount of current, leaker circuit 224 and leaker circuit 226 prevent the LOW output of the level shifter from dropping to $V1_{SS}$, and, hence, prevent the LOW output of the level shifter from dropping to a low voltage capable of imposing stress on the second-stage level shifter, as described in greater detail below.

Figure 6:
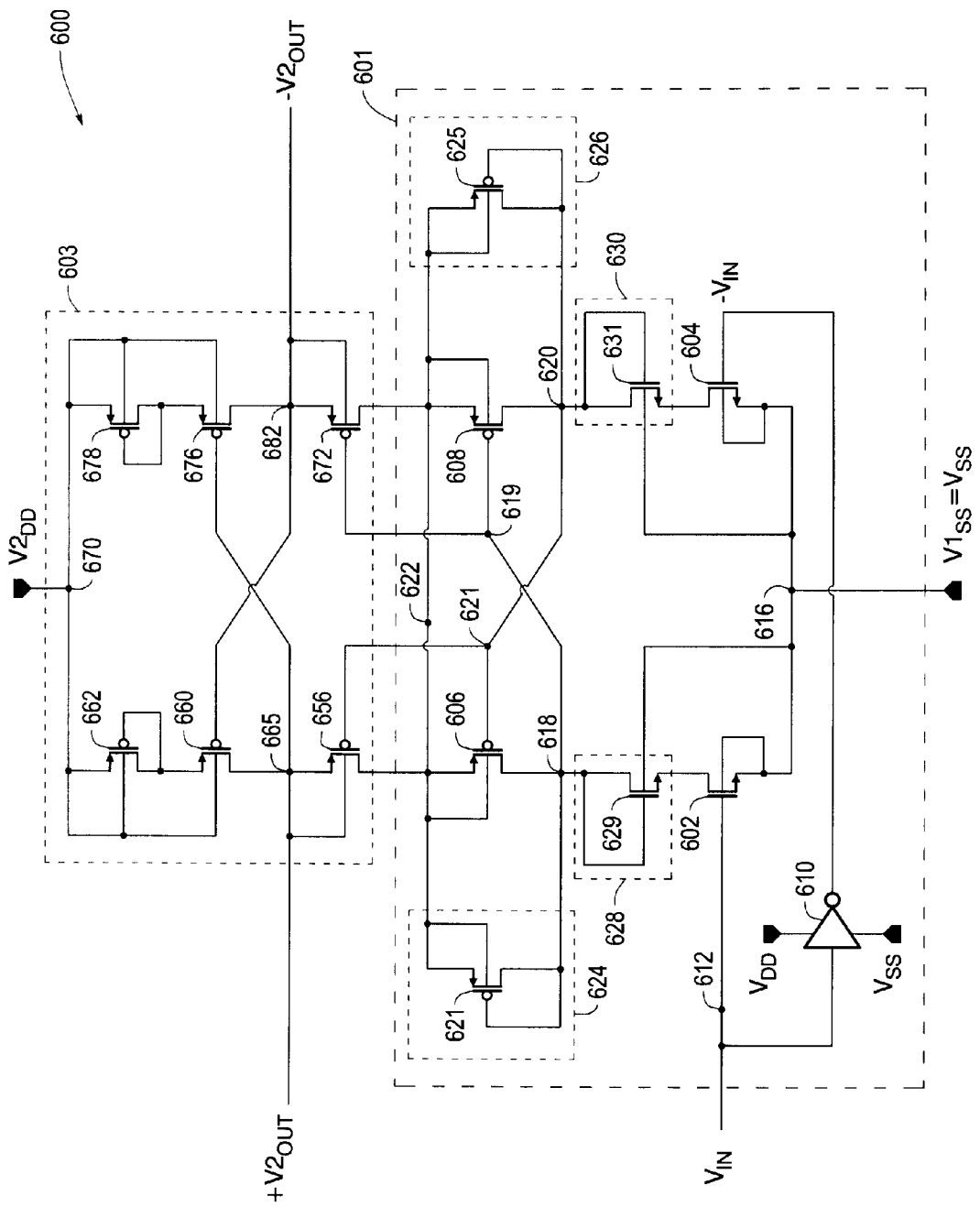
FIG. 6 is an example circuit embodiment of an integrated first-stage and second-stage of the level shifter shown in FIG. 1.
Figure 7:
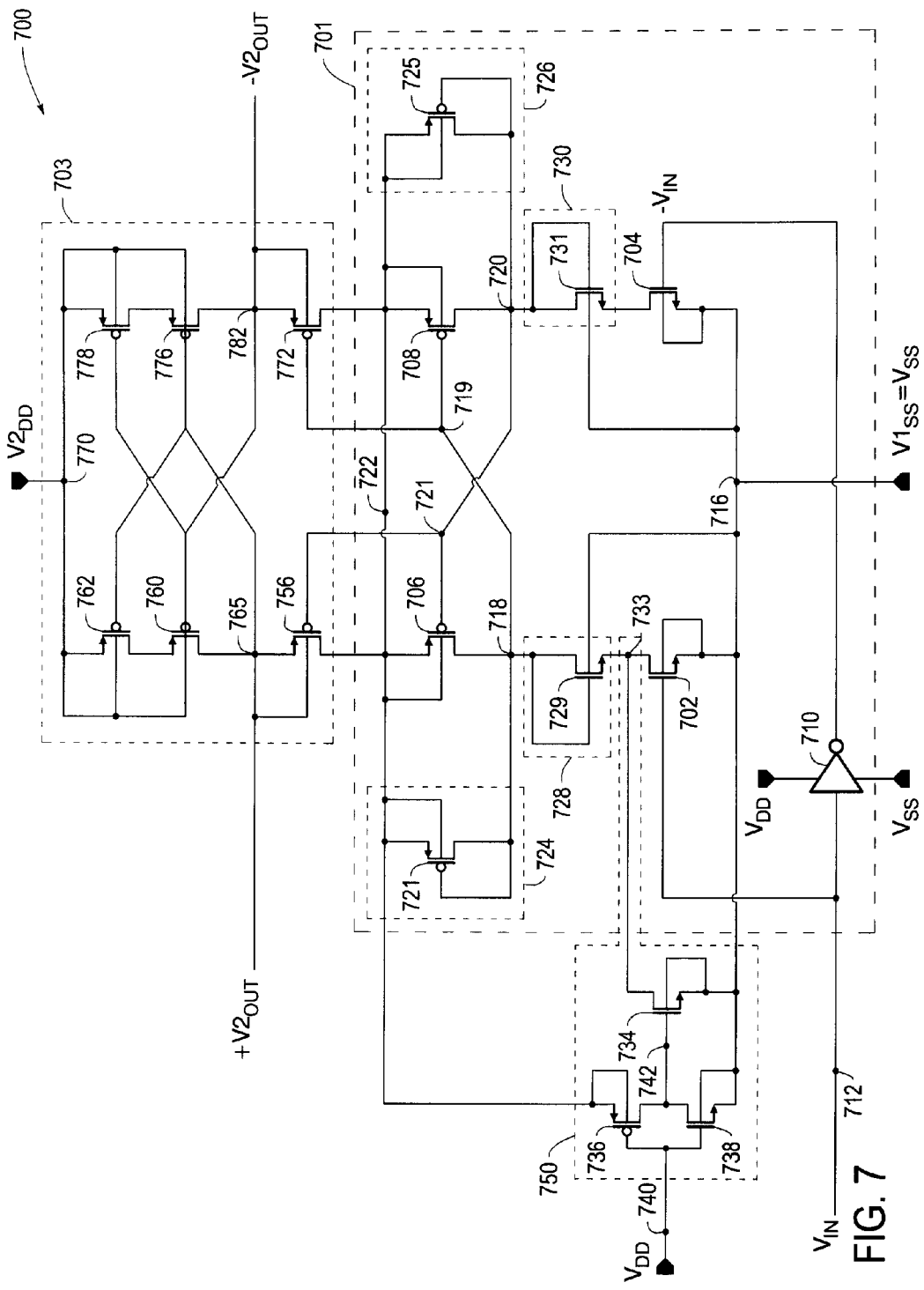
FIG. 7 is another example circuit embodiment of an integrated first-stage and second-stage of the level shifter shown in FIG. 1.
Figure 10:
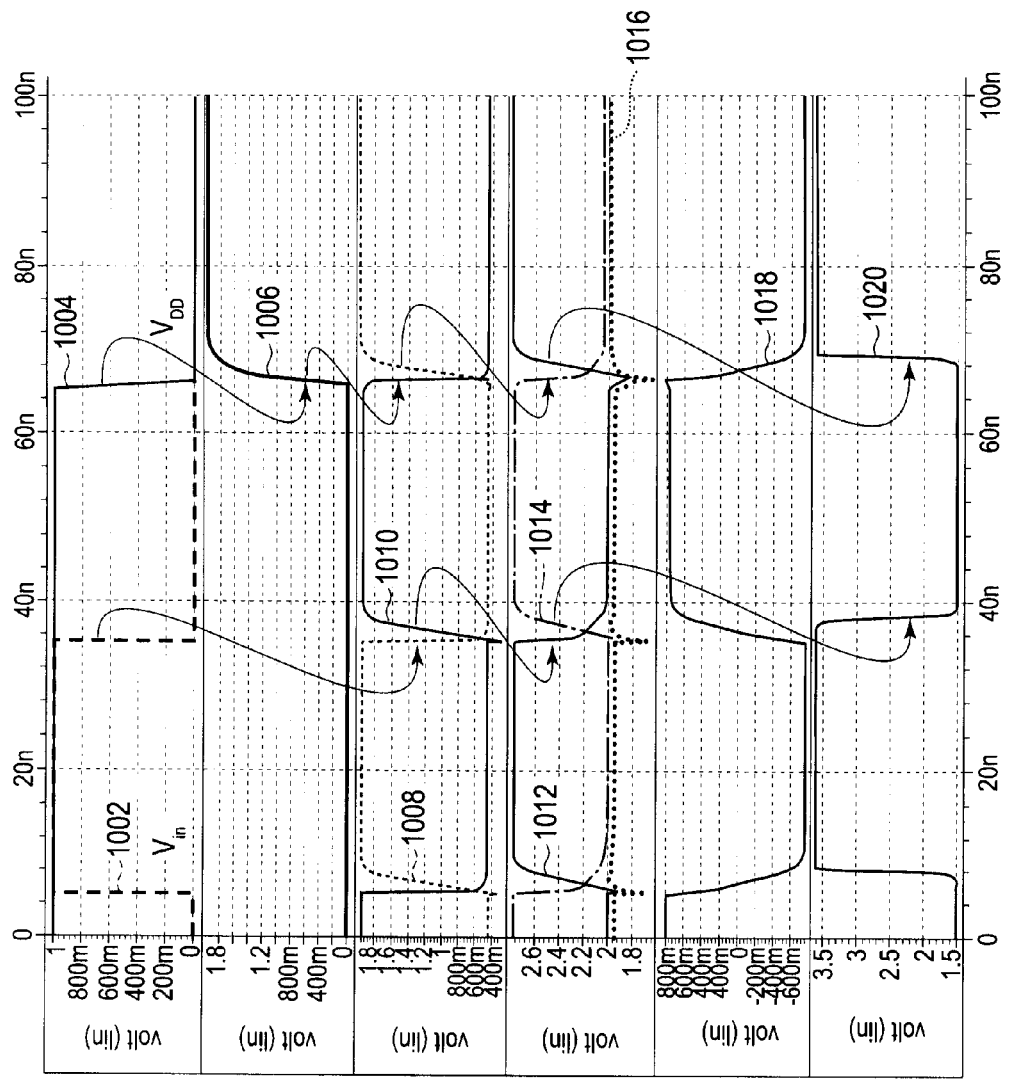
FIG. 10 shows plots of representative signals that may be one of supplied to, or generated by, circuit embodiments of the level shifter of FIG. 1.

Third, by making sure that there is a constant current flow through first-stage level shifter circuit embodiment 200, either through the left or right branch, allows the second-stage level shifter to be self-biased when the first and second-stage level shifters are combined and, hence, eliminates the need for an intermediate power supply, e.g., an intermediate power supply of 1.8 volts, to drive the second-stage level shifter, as described in greater detail with respect to FIG. 6, FIG. 7 and FIG. 10.

For example, when $V_{IN}$ is HIGH, $-V_{IN}$, is LOW, and transistor 221, transistor 223 and transistor 202 are all CLOSED. Hence, current is able to flow through the left side of first-stage level shifter circuit embodiment 200 and pass through diode circuit 228, resulting in a voltage across N-MOS transistor 229. As a result, the voltage, $-V1_{OUT}$, at node 218, which is driven LOW when $V_{IN}$ is HIGH, is held at a voltage above $V1_{SS}$, thus limiting the output swing of the first-stage level shifter to a swing that is less than $V1_{DD}$ minus $V1_{SS}$, thereby assuring that the LOW output of first-stage level shifter circuit embodiment 200 cannot induce over-voltage stress in the transistors of the first stage level shifter or in the transistors of downstream circuit stages. In such a manner, a voltage swing limitation may be imposed at the LOW voltage state. Consequently, by limiting the voltage swing without limiting the HIGH voltage state, a higher starting point for voltage amplification in downstream stages of the level shifter can be provided without stressing transistors in downstream stages of the level shifter, thus allowing higher differential stage output voltages and higher final output voltages to be achieved without inducing over-voltage stress in transistors of downstream stages of the level shifter. When $V_{IN}$ is LOW, and transistor 225, transistor 227 and transistor 204 are all CLOSED. Hence, current is able to flow through the right side of first-stage level shifter circuit embodiment 200 and pass through diode circuit 230, resulting in a voltage across N-MOS transistor 231. As a result, the voltage, $V1_{OUT}$, at node 220, which is driven LOW when $V_{IN}$ is LOW, is held at a voltage above $V1_{SS}$, thus, once again, limiting the output swing of the first-stage level shifter to a swing less than $V1_{DD}$ minus $V1_{SS}$ and assuring that the LOW output of first-stage level shifter circuit embodiment 200 does not induce over-voltage stress.

It is noted that in one example embodiment, leaker circuit 224 and leaker circuit 226, may be modified to include a single P-type MOS transistor, rather than two P-type MOS transistors configured in series, as described above. In such an embodiment, leaker circuit 224 may be replaced with a single P-type MOS transistor with a drain terminal and a base terminal connected to HIGH voltage source, $V1_{DD}$, at node 222, and a gate terminal and a source terminal connected to node 218. Leaker circuit 226 may be replaced with a single P-type MOS transistor with a drain terminal and a base terminal connected to HIGH voltage source, $V1_{DD}$, at node 222, and a gate terminal and a source terminal connected to node 220.

Figure 3:
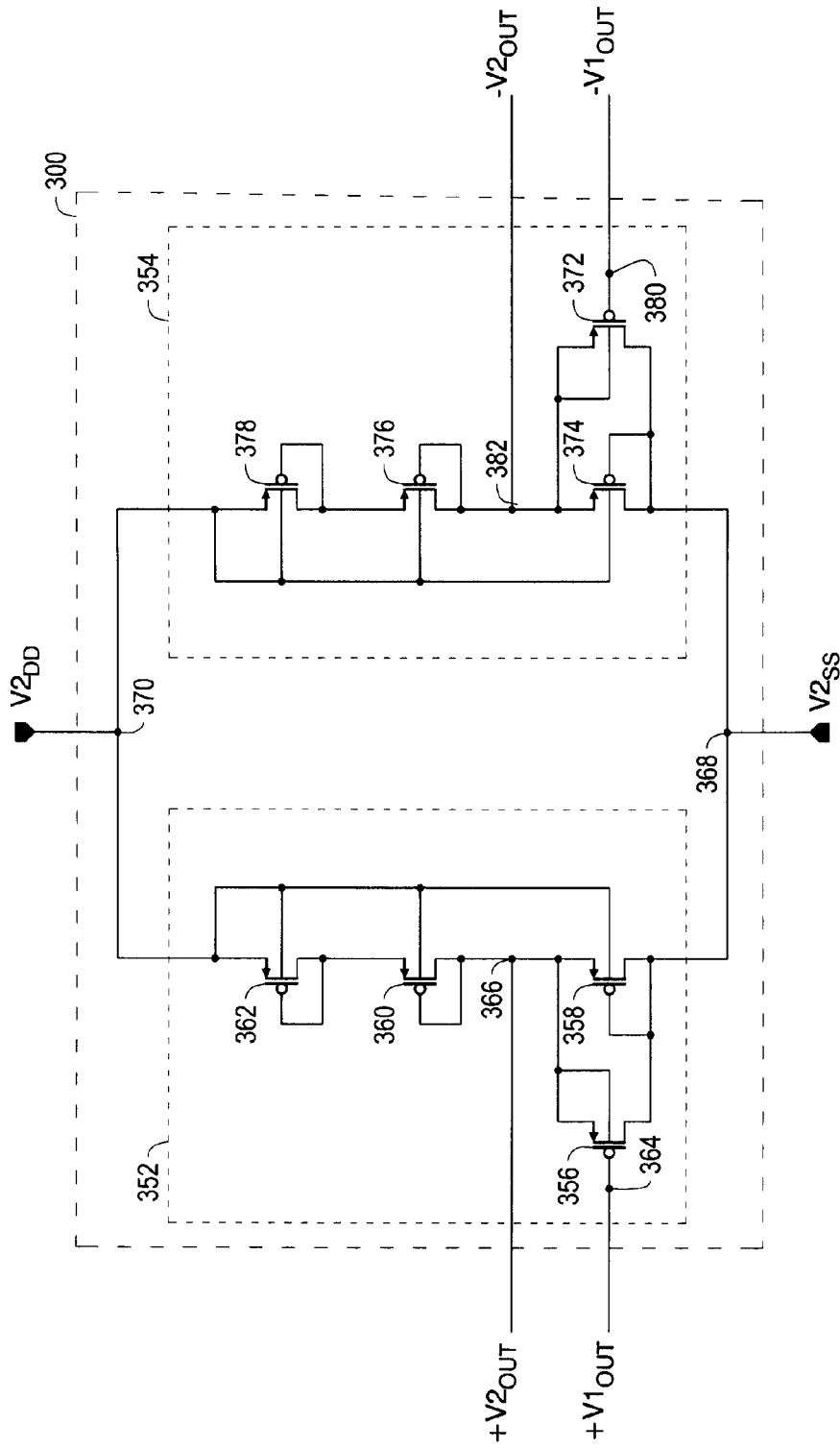
FIG. 3 is an example circuit embodiment of the second-stage level shifter shown in FIG. 1.

FIG. 3 is a first example embodiment of the second-stage level shifter, described above with respect to FIG. 1. As shown in FIG. 3, a first example circuit embodiment 300 of second-stage level shifter circuit may be configured as a differential input to differential output level shifter that includes a first branch 352, a second branch 354, a LOW voltage source, $V2_{SS}$, and high voltage source, $V2_{DD}$. First branch 352 and second branch 354 may be similar in circuitry, but may differ with respect to the input signals received and the output signals generated. For example, first branch 352 may receive signal $+V1_{OUT}$ and may generate shifted second output signal, $+V2_{OUT}$, while second branch 354 may receive signal $-V1_{OUT}$ and may generate shifted second output signal, $-V2_{OUT}$. In accordance with an embodiment, second stage level shifter may be configured without circuitry to limit the voltage swing of its outputs, inasmuch as suitable stress avoiding voltage swing has already been provided in upstream voltage shifting stages.

As shown in FIG. 3, first branch 352 of second-stage level shifter circuit 300 may include P-type MOS transistor 356, P-type MOS transistor 358, P-type MOS transistor 360, and P-type MOS transistor 362. P-type MOS transistor 358, P-type MOS transistor 360, and P-type MOS transistor 362 may be configured in series to form a voltage divider stack in which the three transistors are each configured as an active resistor by connecting the gate terminal of each transistor in the stack to its respective drain terminal. As shown in FIG. 3, the source of P-type MOS transistor 362 may be connected to the high voltage source, V2$_{DD}$, at node 370, and the drain of P-type MOS transistor 362 may be connected to the source of P-type MOS transistor 360. The drain of P-type MOS transistor 360 may be connected to the source of P-type MOS transistor 358, at node 366, and the drain of P-type MOS transistor 358 may be connected to the LOW voltage source, V2$_{SS}$, at node 368. Further P-type MOS transistor 356 may be connected in parallel with P-type MOS transistor 358 with the source of P-type MOS transistor 356 connected to the source of P-type MOS transistor 358 and the drain of P-type MOS transistor 356 connected to the drain of P-type MOS transistor 358 at node 368. The base of P-type MOS transistor 356 may be connected to its source at node 366, the base of P-type MOS transistor 358, of P-type MOS transistor 360 and of P-type MOS transistor 362 may be connected to the high voltage source, V2$_{DD}$, at node 370. The shifted first output signal, +V1out, may be received from the first-stage level shifter via the gate of P-type MOS transistor 356 at node 364 and a corresponding shifted second output signal, +V2out, may be generated at node 366.

As further shown in FIG. 3, second branch 354 of second-stage level shifter circuit 300 may include P-type MOS transistor 372, P-type MOS transistor 374, P-type MOS transistor 376, and P-type MOS transistor 378. P-type MOS transistor 374, P-type MOS transistor 376, and P-type MOS transistor 378 may be configured in series to form a voltage divider stack in which the three transistors are each configured as an active resistor by connecting the gate terminal of each transistor in the stack its respective drain terminal. As shown in FIG. 3, the source of P-type MOS transistor 378 may be connected to the high voltage source, V2$_{DD}$, at node 370, and the drain of P-type MOS transistor 378 may be connected to the source of P-type MOS transistor 376. The drain of P-type MOS transistor 376 may be connected to the source of P-type MOS transistor 374, at node 382, and the drain of P-type MOS transistor 374 may be connected to the LOW voltage source, V2$_{SS}$, at node 368. Further P-type MOS transistor 372 may be connected in parallel with P-type MOS transistor 374 with the source of P-type MOS transistor 372 connected to the source of P-type MOS transistor 374 and the drain of P-type MOS transistor 372 connected to the drain of P-type MOS transistor 372 at node 368. The base of P-type MOS transistor 372 may be connected to its source at node 382, the base of P-type MOS transistor 374, of P-type MOS transistor 376 and of P-type MOS transistor 378 may be connected to the high voltage source, V2$_{DD}$, at node 370. The inverted shifted first output signal, −V1out, may be received from the first-stage level shifter via the gate of P-type MOS transistor 372 at node 380 and a corresponding inverted shifted second output signal, −V2out, may be generated at node 382.

In operation, if received signal +V1$_{OUT}$ received at node 364 is LOW, transistor 356 is CLOSED and the voltage of +V2$_{OUT}$ at node 366 is pulled down to V2$_{SS}$. If received signal +V1$_{OUT}$ received at node 364 is HIGH, transistor 356 is OPEN and the voltage of +V2$_{OUT}$ at node 366 is the voltage of V2$_{SS}$ plus the source-to-drain voltage of transistor 358. If received signal −V1$_{OUT}$ received at node 380 is LOW, transistor 372 is CLOSED and the voltage of −V2$_{OUT}$ at node 382 is pulled down to V2$_{SS}$. If received signal −V1$_{OUT}$ received at node 380 is HIGH, transistor 372 is OPEN and the voltage of −V2$_{OUT}$ at node 382 is the voltage of V2$_{SS}$ plus the source-to-drain voltage of transistor 374.

Figure 4:
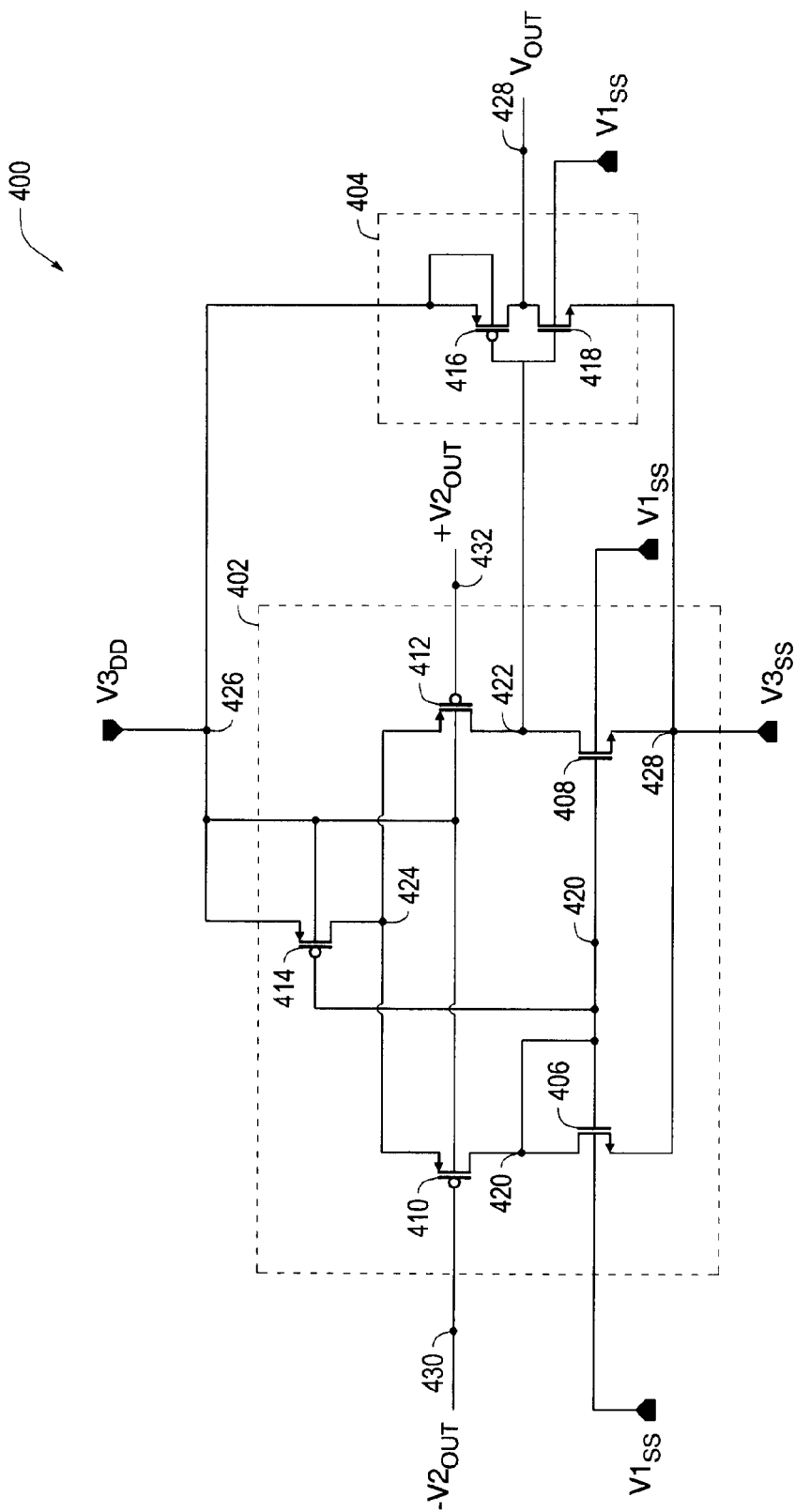
FIG. 4 is an example circuit embodiment of the comparator shown in FIG. 1.

FIG. 4 is a first example circuit embodiment 400 of comparator 106, described above with respect to FIG. 1. Example circuit embodiment 400 may receive differential signals from second-stage level shifter 104, and based on these inputs, may generate a single ended output signal that has a shifted voltage level that is greater than the original single ended input and greater than the maximum source-to-drain voltage tolerances of transistors in the circuit. Such a single ended output signal is achieved by level shifter 100 without stressing the transistors within level shifter 100. As shown in FIG. 4, a comparator circuit 400 may include a voltage comparing circuit 402, a pull-up/pull-down circuit 404, a HIGH voltage source, V3$_{DD}$, a LOW voltage source, V3$_{SS}$, and a connection to LOW voltage source, V1$_{SS}$, which may be the same LOW voltage source, V1$_{SS}$, described above with respect to FIG. 2.

As further shown in FIG. 4, a voltage comparing circuit 402 may include N-type MOS transistor 406, N-type MOS transistor 408, P-type MOS transistor 410, P-type MOS transistor 412, and P-type MOS transistor 414. The source of P-type MOS transistor 414 may be connected to a high voltage source, V3$_{DD}$, at node 426, and the drain of P-type MOS transistor 414 may be connected to the source of P-type MOS transistor 410 and P-type MOS transistor 412 at node 424. The drain of P-type MOS transistor 410 may be connected to the source of N-type MOS transistor 406 at node 420, and the drain of P-type MOS transistor 412 may be connected to the source of N-type MOS transistor 408 at node 422. The drain of N-type MOS transistor 406 may be connected to the drain of N-type MOS transistor 408 and to LOW voltage source, V3$_{SS}$, at node 428. The gate of P-type MOS transistor 414, N-type MOS transistor 406 and N-type MOS transistor 408, may be connected at node 420. The base of P-type MOS transistor 410, the base of P-type MOS transistor 412, and the base of P-type MOS transistor 414 may be connected to voltage source, V3$_{DD}$, at node 426. The base of N-type MOS transistor 406 and the base of N-type MOS transistor 408 may be connected to LOW voltage source, V1$_{SS}$.

Pull-up/pull-down circuit 404 may include a P-type MOS transistor 416 and an N-type MOS transistor 418. The source of P-type MOS transistor 416 may be connected to HIGH voltage source, V3$_{DD}$, at node 426. The drain of HIGH voltage source 416 may connect to the source of N-type MOS transistor 418, and the drain of N-type MOS transistor 418 may be connected to LOW voltage source, V3$_{SS}$, at node 428. The gate of P-type MOS transistor 416 and the gate of N-type MOS transistor 418 may be connected to an output of voltage comparing circuit 402 at node 422.

In operation, voltage comparing circuit 402 may receive signal −V2$_{OUT}$ at node 430 and may receive signal +V2$_{OUT}$ at node 432. If +V2$_{OUT}$ is HIGH and −V2$_{OUT}$ is LOW the voltage at node 422 which is provided as an input signal to pull-up/pull-down circuit 404 is LOW. In response to a LOW signal value at node 422, N-type MOS transistor 418 is OPEN and P-type MOS transistor 416 is CLOSED, therefore the value of shifted output signal V$_{OUT}$ is pulled-up to HIGH voltage source, V3$_{DD}$. If +V2$_{OUT}$ is LOW and −V2$_{OUT}$ is HIGH the voltage at node 422 which is provided as an input signal to pull-up/pull-down circuit 404 is HIGH. In response to a HIGH signal value at node 422, N-type MOS transistor 418 is CLOSED and P-type MOS transistor 416 is OPEN, therefore the value of shifted output signal V$_{OUT}$ is pulled-down to LOW voltage source, V3$_{SS}$. Hence, the shifted output signal V$_{OUT}$ may be LOW when input signal V$_{IN}$ is LOW and may be HIGH when input signal V$_{IN}$ is HIGH.

Figure 5:
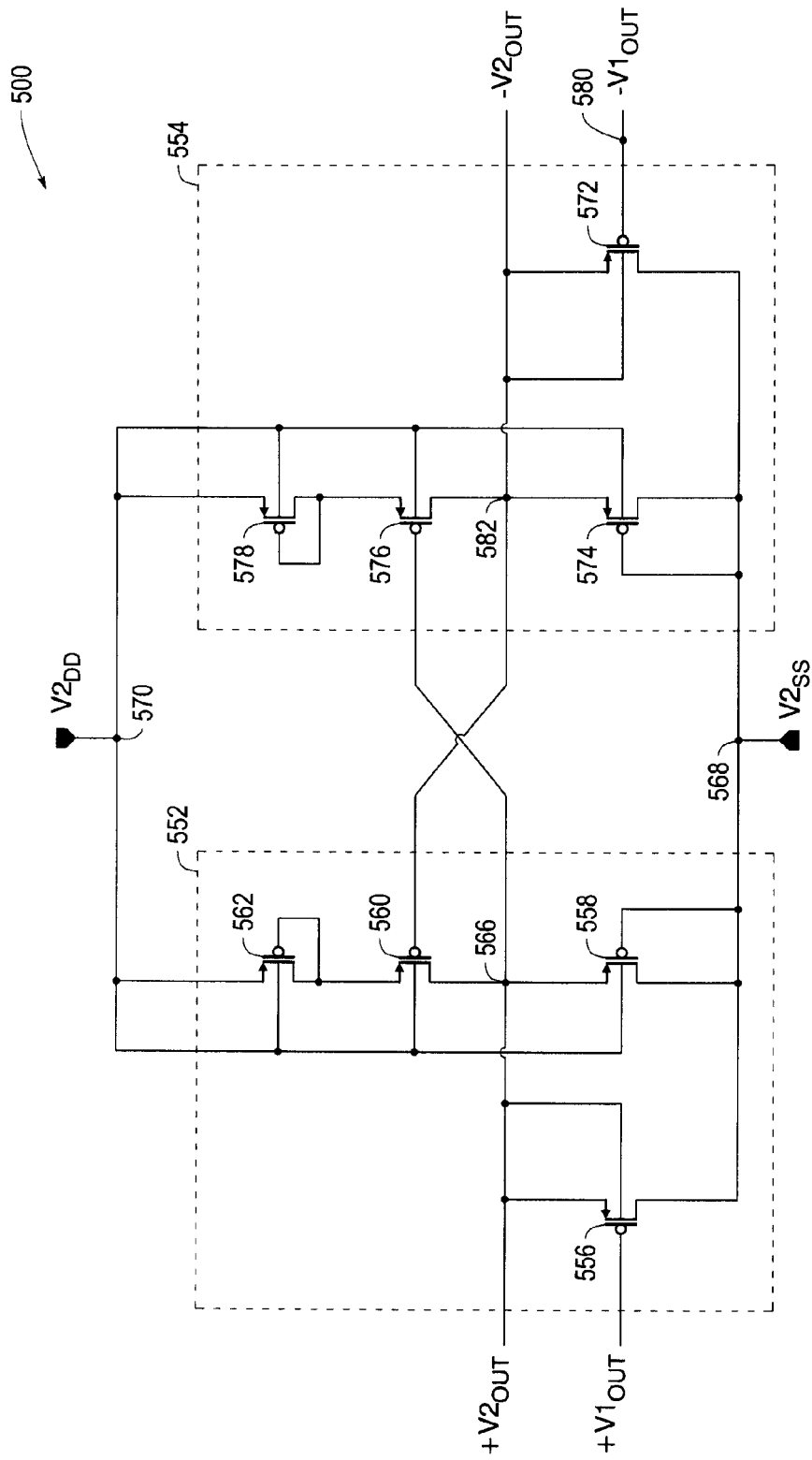
FIG. 5 is another example circuit embodiment of the second-stage level shifter shown in FIG. 3.

FIG. 5 is a second example circuit embodiment 500 of second-stage level shifter 104, described above with respect to FIG. 1, and represents another differentially configured version of the first example circuit embodiment 300 of second-stage level shifter 104, described above with respect to FIG. 3. Nodes and components in FIG. 5 are similar to the nodes and components described above with respect to FIG. 3. Therefore, nodes and components in FIG. 5 have been assigned numeric labels in which the last two digits correspond to the same last two digits of the numeric label assigned to corresponding components in FIG. 3, preceded by the figure number, i.e., "5." For example, a P-MOS transistor in FIG. 5 that corresponds to P-MOS transistor 362 in FIG. 3 is labeled 562 in FIG. 5.

As shown in FIG. 5, second example circuit embodiment 500 of second-stage level shifter circuit 104 may include a first branch 552, a second branch 554, a LOW voltage source, $V2_{SS}$, and high voltage source, $V2_{DD}$. First branch 552 and second branch 554 are similar in configuration to first branch 352 and second branch 354 in first example circuit embodiment 300 of second-stage level shifter circuit 104 described above with respect to FIG. 3. These components and their connectivity and function have been described above with respect to FIG. 3 and, therefore, will not again be described.

Second-stage level shifter circuit embodiment 500 differs from first-stage level shifter circuit embodiment 300 in that first branch 552 and second branch 554 have been crossed over relative to the inputs. Specifically, the gate of P-type transistor 560 in first branch 552 is connected to node 582 of second branch 554, and the gate of P-type transistor 576 in second branch 554 is connected to node 566 of first branch 554. Configuring first branch 552 and second branch 554 in such a manner allows the circuit to support a wide range of operation, as described in greater detail below.

FIG. 6 is a first example embodiment of an integrated shifter circuit 600 that combines first-stage level shifter 102 and second-stage level shifter 104, described above with respect to FIG. 1. As shown in FIG. 6, shifter circuit 600 may include a first-stage level shifter circuit 601, which has nodes and components that are similar to the nodes and components of first-stage level shifter circuit embodiment 200 described above with respect to FIG. 2, and a second-stage level shifter circuit 603, which has nodes and components that are similar to the nodes and components of second-stage level shifter circuit embodiment 500 described above with respect to FIG. 5. Therefore, nodes and components in first-stage level shifter circuit 601 have been assigned numeric labels in which the last two digits represent the same numeric label assigned to corresponding components in FIG. 2, preceded by the figure number, i.e., "6." For example, a P-MOS transistor in FIG. 6 that corresponds to P-MOS transistor 206 in FIG. 2 is labeled 606 in FIG. 6. Further, nodes and components in second-stage level shifter circuit 603 have been assigned numeric labels in which the last two digits represent the same numeric label assigned to corresponding components in FIG. 5, preceded by the figure number, i.e., "6." For example, a P-MOS transistor in FIG. 6 that corresponds to P-MOS transistor 562 in FIG. 5 is labeled 662 in FIG. 6.

As shown in FIG. 6, shifter circuit 600 may include a first-stage level shifter circuit 601, a second-stage level shifter circuit 603, a LOW voltage source, $V1_{SS}$, and a high voltage source, $V2_{DD}$. First-stage level shifter circuit 601 is similar in configuration to first-stage level shifter circuit embodiment 200 described above with respect to FIG. 2. These components, their connectivity and function have been described above with respect to FIG. 2 and, therefore, will not again be described. Second-stage level shifter circuit 603 is similar in configuration to the second-stage level shifter circuit embodiment 500 described above with respect to FIG. 5. These components, their connectivity and function have been described above with respect to FIG. 5 and, therefore, will not again be described.

First-stage level shifter 601 differs from first-stage level shifter circuit embodiment 200 in that leaker circuit 624 and leaker circuit 626, are modified to include a single P-type MOS transistor, rather than two P-type MOS transistors configured in series, as described above. Specifically, leaker circuit 624 has been replaced with a single P-type MOS transistor 621 with a source terminal and a base terminal connected to node 622, and a gate terminal and a drain terminal connected to node 618. Leaker circuit 626 has been replaced with a single P-type MOS transistor 625 with a source terminal and a base terminal connected to node 622, and a gate terminal and a drain terminal connected to node 620.

Second-stage level shifter 603 differs from second-stage level shifter 500 in that P-type transistors corresponding to P-type transistor 558 and P-type transistor 574 in the FIG. 5 are not provided in second-stage level shifter 603. In FIG. 5, P-type transistor 558 is configured as a third diode/active-resistor in a voltage dividing stack that includes P-type transistor 560 and P-type transistor 562 on the left side of circuit 500; P-type transistor 574 is configured as a third diode/active-resistor in a voltage dividing stack that includes P-type transistor 576 and P-type transistor 578 on the right side of circuit 500. In shifter circuit 600, no such third diode/active-resistor is required. The voltage divider functionality between node 670 and node 665 on the left side of second-stage level shifter 603 is performed with P-type MOS transistor 662 and P-type MOS transistor 660. The voltage divider functionality between node 670 and node 682 on the right side of second-stage level shifter 603 is performed with P-type MOS transistor 678 and P-type MOS transistor 676. Further, second-stage level shifter 603 may receive signal $+V1_{OUT}$ from node 620, which corresponds to node 220 in FIG. 2, via node 621, and may receive $-V1_{OUT}$ from node 618, which corresponds to node 218 in FIG. 2, via node 619.

First-stage level shifter 601 and second-stage level shifter 603 in integrated shifter circuit 600 further differ from the stand-alone versions of each described above with respect to FIG. 2 and FIG. 5, respectively, in that externally generated HIGH voltage source, $V1_{DD}$, shown in FIG. 2, and externally generated LOW voltage source, $V2_{SS}$, shown in FIG. 5 are not required. In integrated shifter circuit 600, the drain of P-type MOS transistor 656 and the drain of P-type MOS transistor 672 are connected to node 622, whereas the drains of corresponding transistors in FIG. 5 are connected to LOW voltage source, $V2_{SS}$. Further, the source and base of P-type MOS transistor 621, the source and base of P-type MOS transistor 606, the source and base of P-type MOS transistor 608, and the source and base of P-type MOS transistor 625, are also connected to node 622, whereas the corresponding terminals of corresponding transistors in FIG. 2 are connected to HIGH voltage source, $V1_{DD}$. Node 622 in shifter circuit 600 is self-biased and held at a stable voltage by a constant current flow provide by leaker circuit 624 and leaker circuit 626. As described below with respect to FIG. 10 signal 1016, the self-biased voltage at node 622 may be held at a relatively constant voltage, e.g., approximately 2 volts, that may be within an operational tolerance, e.g., ±10%, of both HIGH voltage source, $V1_{DD}$, and LOW voltage source, $V2_{SS}$. Therefore, first-stage level shifter 601 and second-stage level shifter 603 may be joined, as described above, without adversely affecting functional operation of the circuit.

Combining first-stage level shifter 601 and second-stage level shifter 603 in integrated shifter circuit 600 results in a more efficient design in that fewer transistors are required to implement a comparable network, and eliminates the need for an intermediate power source that otherwise would be required to provide power at node 622. By eliminating the need for the intermediate power source, circuitry and control lines associated with the intermediate power source are also no longer required, therefore further reducing the complexity and power consumption the circuit and, hence, improving reliability and availability of integrated shifter circuit 600 over a design the implements first-stage level shifter 601 and second-stage level shifter 603 separately using an intermediate power supply.

FIG. 7 is another illustrative embodiment of an integrated shifter circuit 700 that combines first-stage level shifter 102 and second-stage level shifter 104, described above with respect to FIG. 1. As shown in FIG. 7, shifter circuit 700 includes nodes and components that are similar to the nodes and components of first example embodiment of an integrated shifter circuit 600, described above with respect to FIG. 6. Therefore, nodes and components in shifter circuit 700 have been assigned numeric labels in which the last two digits represent the same numeric label assigned to corresponding components in FIG. 6, preceded by the figure number, i.e., "7." For example, a P-MOS transistor in FIG. 7 that corresponds to P-MOS transistor 662 in FIG. 6 is labeled 762 in FIG. 7.

As shown in FIG. 7, shifter circuit 700 may include a first-stage level shifter circuit 701, a second-stage level shifter circuit 703, a LOW voltage source, $V1_{SS}$, and a HIGH voltage source, $V2_{DD}$. Shifter circuit 700 is similar in configuration to shifter circuit 600 described above with respect to FIG. 6. These components, their connectivity and function have been described above with respect to FIG. 6 and, therefore, will not again be described.

Shifter circuit 700 differs from shifter circuit 600 in that the gate of P-type MOS transistor 762 is connected to node 765, the gate of P-type MOS transistor 778 is connected to node 782, and an input signal sensing and bypass circuit 750 has been added. As shown in FIG. 7, input signal sensing circuit 750 may include N-type MOS transistor 734, P-type MOS transistor 736 and N-type MOS transistor 738.

Connecting the gate of P-type MOS transistor 762 to node 765 and connecting the gate of P-type MOS transistor 778 to node 782 enhances the stability of the circuit and allows the circuit to support a wide range of operation, as described in greater detail below.

Input signal sensing and bypass circuit 750 may be used to monitor the HIGH voltage source $V_{DD}$, associated with the incoming 0-1.0 input signal, $V_{IN}$, and inverted input signal, $-V_{IN}$. Input signal sensing and bypass circuit 750 may be used by shifter circuit 700 to place shifter circuit 700 in a defined stable state whenever input signal, $V_{IN}$, is undefined, i.e., not present. In this manner, shifter circuit 700 will avoid undefined states at nodes within shifter circuit 700 that may result in over-voltage stress to one or more transistors in shifter circuit 700. Moreover, the output of the level shifter will be set to a predefined voltage.

In operation, input signal sensing and bypass circuit 750 may receive HIGH voltage source, $V_{DD}$, at node 740. If the power, $V_{DD}$, is present, the voltage at node 740 is HIGH, P-type MOS transistor 736 is OPEN, N-type MOS transistor 738 is CLOSED, the voltage at node 742 at the gate of N-type MOS transistor 734 is LOW and, therefore, N-type MOS transistor 734 is OPEN. As a result, the remainder of shifter circuit 700 is unaffected by the presence of input signal sensing and bypass circuit 750 and may proceed to generate shifted output signals, $+V2_{OUT}$ and $-V2_{OUT}$, as described above. However, if the signal, $V_{DD}$, is not present, the voltage at node 740 is LOW, P-type MOS transistor 736 is CLOSED, N-type MOS transistor 738 is OPEN, the voltage at node 742 at the gate of N-type MOS transistor 734 is pulled-up HIGH and, therefore, N-type MOS transistor 734 is CLOSED, and the voltage at node 733 is pulled-down to LOW voltage source $V1_{SS}$, thereby generating the same voltage at node 733 as would be present if a HIGH input signal $V_{IN}$, is being received.

Using such a technique, signal sensing and bypass circuit 750 monitors HIGH voltage source, $V_{DD}$, a proxy for monitoring the presence of input signal, $V_{IN}$. When HIGH voltage source, $V_{DD}$, is lost, N-type MOS transistor 702 is by-passed and a stable LOW value is generated at node 733, as would be present if a HIGH input signal $V_{IN}$, is being received. In this manner, signal sensing and bypass circuit 750 may allow shifter circuit 700 to avoid undefined states at nodes within shifter circuit 700 that may result in over-voltage stress to one or more transistors in shifter circuit 700. Moreover, the output of the level shifter will be set to a predefined voltage.

Figure 8:
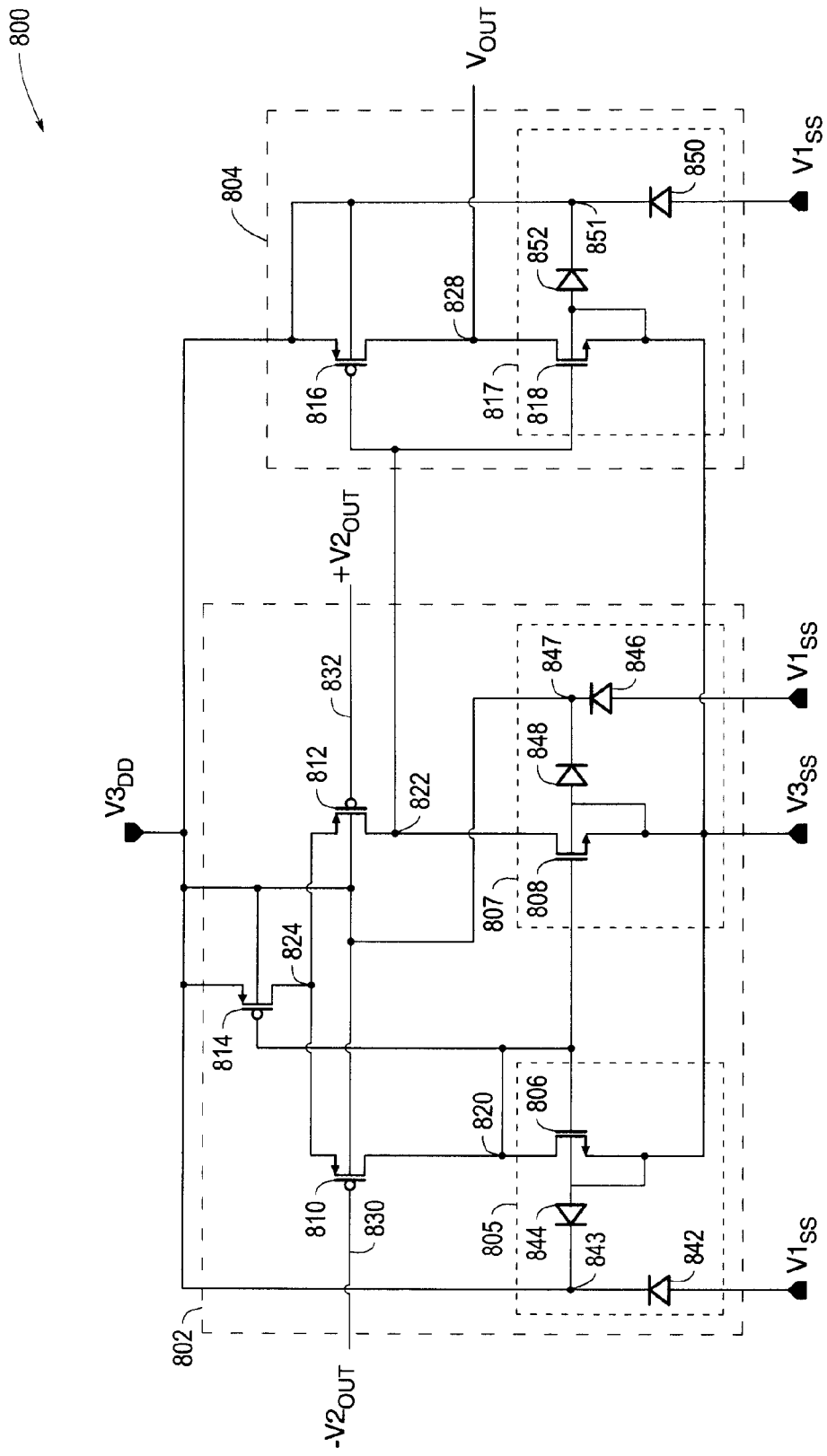
FIG. 8 is another example circuit embodiment of the comparator shown in FIG. 1.

FIG. 8 is a second example circuit embodiment 800 of comparator 106, described above with respect to FIG. 1. As shown in FIG. 8, a comparator circuit 800 may include a voltage comparing circuit 802, a pull-up/pull-down circuit 804, a HIGH voltage source, $V3_{DD}$, a LOW voltage source, $V3_{SS}$, and a LOW voltage source, $V1_{SS}$, which may be the same LOW voltage source, $V1_{SS}$, described above with respect to FIG. 2. Comparator circuit 800 is similar in configuration to comparator circuit 400 described above with respect to FIG. 4. Therefore, nodes and components in comparator circuit 800 have been assigned numeric labels in which the last two digits represent the same numeric label assigned to corresponding components in FIG. 4, preceded by the figure number, i.e., "8." For example, a P-MOS transistor in FIG. 8 that corresponds to P-MOS transistor 414 in FIG. 4 is labeled 814 in FIG. 8. These components, their connectivity and function have been described above with respect to FIG. 4 and, therefore, will not again be described.

Comparator circuit 800 may differ from comparator circuit 400 in that comparator circuit 800 may use a triple-well NMOS configuration. As shown in FIG. 8, each triple-well NMOS device may be represented by an NMOS transistor and two additional diodes. For example, triple-well NMOS 805 may include N-type MOS transistor 806, diode 842 and diode 844; triple-well NMOS 807 may include N-type MOS transistors 808, diode 846 and diode 848; and triple-well NMOS 817 may include N-type MOS transistors 818, diode 850 and diode 852, respectively.

Figure 9:
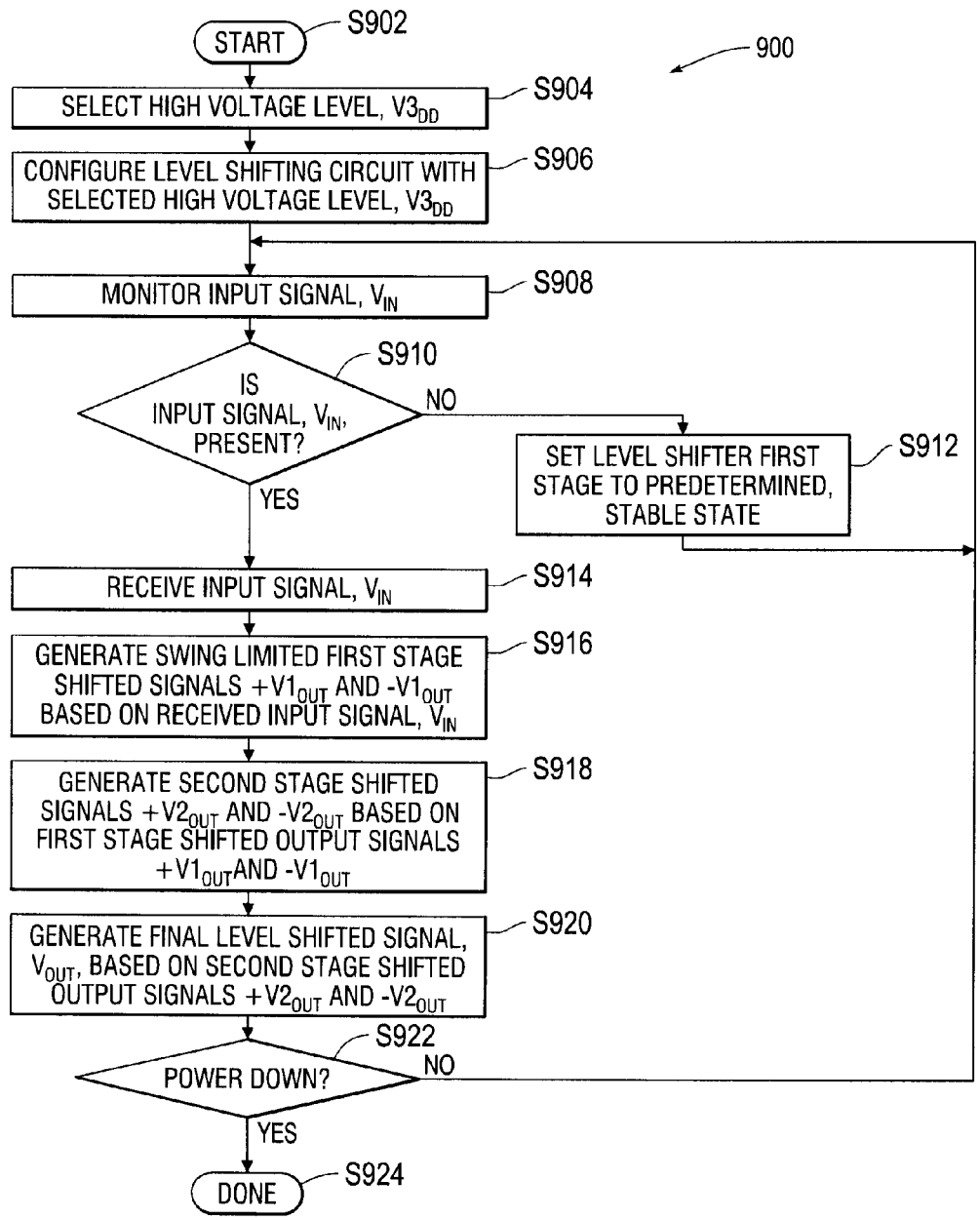
FIG. 9 shows a flow-chart of a process for configuring and operating embodiments of the level shifter of FIG. 1.

FIG. 9 shows a flow-chart of an example process for configuring and operating example embodiments of level shifter 100, as described above with respect to FIG. 1 through FIG. 8. As described above, multi-stage embodiments of level shifter 100 with a voltage limited single ended input to differential output first-stage 102, a differential input to differential output second-stage 104, and a differential input to a single ended output signal third-stage 106 can support a wide range of operation. For example, depending on the requirements of a physical interface to be supported, embodiments of a level shifter 100 may support shifted upper voltage that may range from 2.0 volts to 3.6 volts, without modification of the circuit. Level shifter 100 is able to perform the described level shifting without subjecting any transistor in the circuit to over-voltage stress. As described above, an output voltage swing generated by the first-stage level shifter may be intentionally limited, in order to avoid over-voltage in the both the first-stage level shifter and any subsequent downstream level shifter and other components. As further described above, embodiments of level shifter 100 may support monitoring a received HIGH voltage source as a proxy for a received input signal and may generate a stable logical state upon detecting that the HIGH voltage source, and hence the input signal, has been lost. As shown in FIG. 9, operation of the process begins at step S902 and proceeds to step S904.

In step S904, a HIGH voltage source $V3_{DD}$, may be selected that will produce a desired HIGH voltage in the final shifted output signal, $V_{OUT}$, produced by comparator 106, as described above with respect to FIG. 1 and FIG. 4, and operation of the process continues to step S906.

In step S906, one or more of source voltages $V1_{DD}$, $V1_{SS}$, $V2_{DD}$, $V2_{SS}$, $V3_{SS}$ and $V3_{DD}$ may be applied to level shifter 100, as described above, with respect to FIG. 1 through FIG. 8, and operation of the process continues to step S908.

In step S908, operation of level shifter 100 may be initiated and input signal sensing and bypass circuit 750, described above with respect to FIG. 7, may begin monitoring a received HIGH source voltage, e.g., as a proxy for receipt of input signal, $V1_N$, and operation of the process continues to step S910.

If, in step S910, input signal sensing and bypass circuit 750 determines that a monitored received HIGH source voltage, and hence input signal, $V_{IN}$, is not being received, operation of the process continues to step S912, otherwise, operation of the process continues to step S914.

In step S912, input signal sensing and bypass circuit 750 may set first-stage level shifter 102 to a predetermined, stable state, as described above with respect to FIG. 7, and operation of the process continues to step S908.

In step S914, level shifter 100 may receive input signal $V_{IN}$, and operation of the process continues to step S916.

In step S916, first-stage level shifter 102 may generate swing limited first-stage shifted signals $+V1_{OUT}$ and $-V1_{OUT}$ based on received input signal $V_{IN}$, and operation of the process continues to step S918. In accordance with an embodiment, the voltage swing limitation may be imposed at the LOW voltage state, since the output of the first stage is provided as an input to a downstream level shifter. Consequently, by limiting voltage swing without limiting the HIGH voltage state, a higher starting point for downstream voltage amplification can be provided without stressing transistors.

In step S918, second-stage level shifter 104 may generate second-stage shifted signals $+V2_{OUT}$ and $-V2_{OUT}$ based on received signals $+V1_{OUT}$ and $-V1_{OUT}$ and operation of the process continues to step S920.

In step S920, comparator 106 may generate final shifted single ended output signal $V_{OUT}$ based on received signals $+V2_{OUT}$ and $-V2_{OUT}$ and operation of the process continues to step S922.

If, in step S922, power to level shifter 100 is shut down, operation of the process continues to step S924, and the process terminates, otherwise, operation of the process continues to step S908.

FIG. 10 shows illustrative plots of signal examples that may be one of signals supplied to, or generated by example circuit embodiments of level shifter 100 as described above with respect to FIG. 1 through FIG. 8.

Plot 1002 is a plot of an example input signal, $V_{IN}$, as may be applied to an example embodiment of first-stage level shifter 200 at node 212, as described above with respect to FIG. 2, as may be applied to example embodiment of shifter circuit 600 at node 612, as described above with respect to FIG. 6, and as may be applied to example embodiment of shifter circuit 700 at node 712, as described above with respect to FIG. 7. As shown in plot 1002, example input signal, $V_{IN}$, may be a binary signal with a LOW value of 0.0 volts and a HIGH value of 1.0 volts.

Plot 1004 is a plot of an example HIGH source voltage, $V_{DD}$, as may be applied to inverter 210 in example embodiment of first-stage level shifter 200, as described above with respect to FIG. 2, as may be applied to inverter 610 in example embodiment of shifter circuit 600, as described above with respect to FIG. 6, and as may be applied to inverter 710 in example embodiment of shifter circuit 700, as described above with respect to FIG. 7. As shown in plot 1004, example HIGH source voltage, $V_{DD}$, may be HIGH when example input signal, $V_{IN}$, is present, and may be LOW in the absence of example input signal, $V_{IN}$. For this reason HIGH source voltage, $V_{DD}$, may be monitored by sensing and bypass circuit 750 to determine the presence of input signal, $V_{IN}$.

Plot 1006 is a plot of an example voltage generated by sensing and bypass circuit 750 at node 742, as described above with respect to FIG. 7. It is noted that transition of plot 1006 from LOW to HIGH corresponds with the transition of plot 1004 of HIGH source voltage, $V_{DD}$, from HIGH to LOW. For example, when HIGH source voltage, $V_{DD}$, is not present, the voltage at node 740 is LOW, N-type MOS transistor 738 is OPEN, and P-type MOS transistor 736 is CLOSED, so the voltage at node 742 is pulled HIGH to the bias voltage maintained at node 722, e.g., approximately 2 volts in an embodiment. As a result, N-type MOS transistor 734 is CLOSED and the voltage at node 733 is pulled LOW, thereby placing shifter circuit 700 in a defined stable state and thereby avoiding over-voltage stress to one or more transistors in shifter circuit 700.

Plot 1008 and plot 1010 are plots of output signal $+V1_{OUT}$ and $-V1_{OUT}$, generated by first-stage level shifter 102, for example, at node 220 and node 218, respectively, in the example first-stage level shifter embodiment shown in FIG. 2, or, for example, at node 620 and node 618, respectively, in the example first and second-stage level shifter embodiment shown in FIG. 6, or for example, at node 720 and node 718, respectively, in the example first and second-stage level shifter embodiment shown in FIG. 7. It is noted that, the voltage swing of output signals $+V1_{OUT}$ and $-V1_{OUT}$, is limited to 1.4 volts. As described above with respect to FIG. 1 and FIG. 2, the voltage swing of the first-stage level shifter is purposefully limited to not use the full possible amplification swing, e.g., 1.8 volts±10% that may be supported by transistors in the first-stage level shifter in order to avoid over-voltage stress in transistors of second-stage level shifter. The voltage swing may be limited, for example, at the LOW value by the voltage drop across one of diode circuit 228 and diode circuit 230 as a result of the leakage current generated by one of leakage circuit 224 and leakage circuit 226, respectively, as described above with respect to FIG. 2.

Plot 1012 and plot 1014 are plots of output signal $+V2_{OUT}$ and $-V2_{OUT}$, respectively, generated by second-stage level shifter 104, for example, at node 366 and node 382, respectively, in the example second-stage level shifter embodiment shown in FIG. 3, or, for example, at node 566 and node 582, respectively, in the example second-stage level shifter embodiment shown in FIG. 5, or for example, at node 665 and node 682, respectively, in the example first and second-stage level shifter embodiment shown in FIG. 6. Plot 1016 is a plot of an example bias voltage generated, for example, at node 622 of level shifter 600 described with respect to FIG. 6, or generated, for example, at node 722 of level shifter 700 described with respect to FIG. 7. It is noted that, the voltage swing of output signals $+V2_{OUT}$ and $-V2_{OUT}$, may be limited to approximately a difference between HIGH voltage source $V2_{DD}$ and LOW voltage source $V2_{SS}$, e.g., approximately 0.8 volts. It is further noted that the bias voltage shown in plot 1016 is held at a near constant, e.g. approximately 2.0 volts, with only a slight variation as output signals $+V2_{OUT}$ and $-V2_{OUT}$ transition between HIGH and LOW states.

Plot 1018 is a plot of a calculated difference, $-V2_{OUT}$ minus $+V2_{OUT}$, resulting in a single ended output showing that the difference is less than a 1.8 V±10% transistor rating.

Plot 1020 is a plot of the shifted output, $V_{OUT}$, generated as the result of input signal $V_{IN}$, as described above with respect to FIG. 4. In operation, voltage comparing circuit 106 may receive signal $+V2_{OUT}$ and may receive signal $-V2_{OUT}$. If $+V2_{OUT}$ is HIGH and $-V2_{OUT}$ is LOW, $V_{OUT}$ may be pulled-up to HIGH voltage source, $V3_{DD}$. If $+V2_{OUT}$ is LOW and $-V2_{OUT}$ is HIGH, shifted output signal $V_{OUT}$ may be pulled-down to LOW voltage source, $V3_{SS}$. Hence, the shifted output signal $V_{OUT}$ may be LOW when input signal $V_{IN}$ is LOW and may be HIGH when input signal $V_{IN}$ is HIGH.

It is noted that although the above-described level shifter embodiments are constructed using N-type and P-type MOS transistors, the described level shifter may be implemented within and/or used in conjunction with circuits based on any transistor technology, or combination of transistor technologies, created using any transistor fabrication process.

For purposes of explanation, in the above description, numerous specific details are set forth in order to provide a thorough understanding of the described level shifter. It will be apparent, however, to one skilled in the art that the described level shifter may be practiced without these specific details. In other instances, well-known structures and devices are shown in block diagram form in order to avoid obscuring the features of the described level shifter.

While the described level shifter has been described in conjunction with the specific embodiments thereof, it is evident that many alternatives, modifications, and variations will be apparent to those skilled in the art. Accordingly, embodiments of the described level shifter as set forth herein are intended to be illustrative, not limiting. There are changes that may be made without departing from the spirit and scope of the invention.

What is claimed is:

1. A circuit, comprising:
    a plurality of cascaded shifting stages that are configured to shift a voltage of the circuit by a voltage swing;
    a signal generator that is configured to generate an amplified single level shifted final output signal that has an output voltage level that is higher than an input voltage level, wherein the amplified single level shifted final output signal corresponds to a single binary input signal of a first stage of the cascaded shifting stages and is based on a non-inverted shifted output signal and an inverted shifted output signal of a second stage of the cascaded shifting stages; and
    a diode circuit that is configured to limit a lower voltage of limited voltage swing output signals of the cascaded shifting stages to a non-zero lower value.

2. The circuit of claim 1, wherein the first stage is configured to receive the single binary input signal having an input voltage level.

3. The circuit of claim 2, wherein the first stage is further configured to generate a non-inverted first-stage limited voltage swing shifted output signal and an inverted first-stage limited voltage swing shifted output signal, and a voltage swing of the limited voltage swing output signals swings between the non-zero lower value and an upper value that is less than or equal to the voltage rating.

4. The circuit of claim 3, wherein the second stage is configured to receive the non-inverted first-stage limited voltage swing shifted output signal and the inverted first-stage limited voltage swing shifted output signal.

5. The circuit of claim 4, wherein the signal generator is a comparator that is configured to receive the non-inverted second-stage shifted output signal and the inverted second-stage shifted output signal and configured to generate the amplified single level shifted final output signal.

6. The circuit of claim 2, wherein the first stage is further configured to have a voltage rating that is a maximum source-to-drain voltage rating of a transistor in the first stage.

7. The circuit of claim 4, wherein the second stage is further configured to generate a non-inverted second-stage shifted output signal and an inverted second-stage shifted output signal, and a voltage swing of the non-inverted second-stage shifted output signal and the inverted second-stage shifted output signal swings between a non-zero lower value and an upper value that is less than or equal to the non-zero lower value plus a voltage rating of a transistor in the second stage.

8. The circuit of claim 1, wherein the first stage further comprises:
    a leaker circuit that is configured to provide a constant current flow through the diode circuit to maintain an intermediate voltage that is supplied at least to the second stage.

9. The circuit of claim 1, further comprising:
    a monitoring circuit that is configured to monitor whether the single binary input signal is being received and configured to control the first stage to output a predetermined non-inverted first-stage voltage and a predetermined inverted first-stage voltage.

10. The circuit of claim 9, wherein the monitoring circuit is further configured to monitor a HIGH voltage source associated with the single binary input signal and configured to determine that the single binary input signal is not being received upon determining that the HIGH voltage source is not being received.

11. The circuit of claim 1, wherein the circuit is configured to prevent any transistor in the circuit from being exposed to an over-voltage stress under any operational condition.

12. The circuit of claim 1, wherein the second stage comprises a differential level shifter.

13. The circuit of claim 1, wherein the first stage, the second stage and the signal generator are constructed using thick-oxide P-type and N-type MOS transistors.

14. The circuit of claim 1, wherein the signal generator is further configured to generate a maximum voltage of the amplified single level shifted final output signal that is less than or equal to a non-zero lower value plus a transistor voltage rating defined for a transistor technology used in the circuit.

15. The circuit of claim 1, wherein the circuit is constructed from MOS transistors with a source-to-drain voltage rating of 1.8 volts±10%.

16. A method of generating a level shifted signal using a circuit, comprising:
    shifting a voltage of the circuit by a plurality of cascaded shifting stages with a voltage swing;
    generating an amplified single level shifted final output signal that has an output voltage level that is higher than an input voltage level, wherein the amplified single level shifted final output signal corresponds to a single binary input signal of a first stage of the cascaded shifting stages and is based on a non-inverted shifted output signal and an inverted shifted output signal of a second stage of the cascaded shifting stages; and
    limiting a lower voltage of limited voltage swing output signals of the cascaded shifting stages to a non-zero lower value by a diode circuit.

17. The method of claim 16, further comprising:

generating a voltage swing limited non-inverted first-stage shifted output signal and voltage swing limited inverted first-stage shifted output signal based on the single binary input signal having an input voltage level, wherein a voltage swing of the voltage swing limited first stage shifted output signals swings between a non-zero value and a value that is less than or equal to a voltage rating of a transistor in the circuit generating the first stage shifted output signals.

18. The method of claim 17, further comprising:

generating a non-inverted second-stage shifted output signal and an inverted second-stage shifted output signal based on the non-inverted first-stage shifted output signal and the inverted first-stage shifted output signal.

19. The method of claim 18, wherein an intermediate voltage source used to generate the non-inverted second-stage shifted output signal and the inverted second-stage shifted output signal is based on source voltages used to generate the first stage shifted output signals.

20. The method of claim 16, further comprising:

generating a predetermined constant non-inverted second-stage shifted output signal and a predetermined constant inverted second-stage shifted output signal in response to detecting that the single binary input signal is not being received.

\* \* \* \* \*